United States Patent
Versteegen

(10) Patent No.: US 7,068,099 B2
(45) Date of Patent: Jun. 27, 2006

(54) POWER AMPLIFIER MODULE WITH DISTORTION COMPENSATION

(75) Inventor: Marius Gerardus Jacobus Versteegen, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/494,605

(22) PCT Filed: Oct. 18, 2002

(86) PCT No.: PCT/IB02/04335

§ 371 (c)(1),
(2), (4) Date: May 4, 2004

(87) PCT Pub. No.: WO03/041270

PCT Pub. Date: May 15, 2003

(65) Prior Publication Data

US 2005/0001687 A1 Jan. 6, 2005

(30) Foreign Application Priority Data

Nov. 7, 2001 (EP) .................... 01204276

(51) Int. Cl.
*H03F 1/34* (2006.01)
*H03F 3/68* (2006.01)

(52) U.S. Cl. ....................................................... 330/84
(58) Field of Classification Search ............... 330/69, 330/84, 146
See application file for complete search history.

(56) References Cited

U.S. PATENT DOCUMENTS 4,414,514 A * 11/1983 Seki et al. .................. 330/262
4,433,306 A * 2/1984 Honda et al. ............... 330/297

\* cited by examiner

*Primary Examiner*—Steven J. Mottola

(57) ABSTRACT

The invention relates to a power amplifier module comprising a first amplifier 2 having a first front-end 4 and a first backend amplifier stage 5 and a second amplifier 3 having a second front-end 6 and a second backend amplifier stage 7, the first amplifier and the second amplifier being arranged in a Bridge Tied Load (BTL) configuration with feedback over the load,
characterized in that
the first and the second backend amplifier stages having point symmetrical transfer functions with respect to the origin,
the input current i1 of the first backend amplifier stage being substantially equal to the input current i2 of the second backend amplifier stage.

10 Claims, 3 Drawing Sheets ically, the present invention is particularly advantageous in that
POWER AMPLIFIER MODULE WITH DISTORTION COMPENSATION

FIELD OF THE INVENTION

The invention relates to a power amplifier module and in particular to an audio or high frequency power amplifier, and more particularly to reducing distortion of an amplifier stage.

BACKGROUND AND PRIOR ART

In most audio amplifiers distortion dominantly originates from the non-linear class AB or B biased elements. Generally the backend power amplifier stages operate in class AB or B mode.

Local feedback can be used to minimize the non-linear nature of the input-output transfer characteristic. To further improve the overall linearity it is known to employ a technique of overall negative feedback which is used to achieve the gain stability requirements.

Feedforward is also employed, and it is to be noted that U.S. Pat. No. 4,379,994 suggests the inclusion of an error-generating device to correct for some characteristics of an amplifier, based upon a feedforward circuit and another amplifier. The errors involved, however, are the gross noise and distortion components for which typical compensating networks suffice as the error generator, and not the inherent internal non-linearities of elements themselves.

U.S. Pat. No. 4,549,146 shows a system and method for compensating for non-linearities in electronic circuits.

The distortion effects introduced in a complex multifrequency wave by parametric variations in individual active elements arising from signal and power supply variations in a circuit, such as an audio amplifier, are compensated through the use of replicas of the active elements, and the generation of a feedback signal incorporating comparable distortion. By high gain amplification of the feedback signal in a differential amplifier receiving an input signal that is not comparably distorted a comparison signal is derived containing distortion components. The comparison signal is used in a feedforward path which includes the circuit that is subjected to parametric variations in a sense to cancel the introduced distortions.

The literature shows further power amplifiers with some kind of feedforward distortion compensation. Such power amplifiers are known from "Feedforward Amplifiers Incorporate Parallel Output Summing", Danyuk, IEEE transactions on Circuits and Systems I, Vol. 41, No. 12, December 1994;

"Design and Construction of a Feedforward Error-Correction Amplifier", Takahashi, J. Audio Eng. Soc. Col. 29, No 1/2, January/February 1981, "Feedforward Error Correction in Power Amplifiers", Vanderkooy, J. Audio Eng. Soc. Vol. 28, No. 1/2, January/February 1980.

A common disadvantage of the presented power amplifiers with feedforward distortion compensation is the amount of circuitry required for the compensation.

Another common disadvantage is that the compensation is accurate for only one type of load. Though, for example with audio amplifiers, it's important that they can be used with a wide range of loads (such that a single chip can cover a wide market range).

SUMMARY OF THE INVENTION

It is an object of the present invention to provide an improved power amplified module which overcomes the disadvantages featured by the prior art.

The solution of the underlying problem of the invention is provided by applying the features laid down in the independent claims. Preferred embodiments of the invention are given in the dependent claims.

The present invention is advantageous in that it provides a power amplifier module featuring distortion compensation while making use of the fact that the outputs of opposite sides of a Bridge Tied Load configuration conduct substantially the same currents at any given moment. That is, the controlling inputs of the backend amplifier stages, i.e. the gates in case of MOS power transistors, need the same controlling quantity.

Further the invention is especially applicable in BiMos processes, like Philips Semiconductors ABCD process. In such a process the thermodynamical robustness of low RdsOn of MOST power transistors can be exploited along with the high transconductance and low noise of small bipolar transistors.

In accordance with a preferred embodiment of the invention first and second amplifiers are arranged in a Bridge Tied Load (BTL) configuration with feedback over the load. The backend stages of the amplifiers have point symmetrical transfer functions with respect to the origin. Point symmetrical means that in order to steer one of the outputs of the backend stages up, it would require an input current that is exactly the same current as the current which would be needed to be drawn out of it in order to steer the same output down by the same amount.

For point symmetry within the meaning of the present invention it is sufficient that the first quadrant of the transfer function of one of the backend amplifier stages is identical to the fourth quadrant of the other backend amplifier stage and vice versa. Full point symmetry is therefore not a requirement.

In accordance with a further preferred embodiment of the invention Millering is applied in the backend stages in order to obtain a good stability. The Miller stage within a backend amplifier stage together with the power stage form a non-linear integrator.

In accordance with a further preferred embodiment of the invention two single ended amplifiers are arranged in a Bridge Tied Load (BTL) configuration. Again the transfer functions of the backend stages are point symmetrical with respect to the origin. The output current of one of the backend amplifier stages is doubled by an amplifier. The doubled output current is provided as an input current to the other backend amplifier stage. In this embodiment the amplifiers are driven differentially by an input signal current.

The present invention is particularly advantageous in that it reduces the non-linear distortions caused by power amplification in the class AB or B mode. This is accomplished by adding only minimal additional circuitry. This has the further advantage of a cost efficient realization.

Additionally, the present invention provides accurate compensation, regardless the load that is applied between both output nodes. Whether it is inductive, resistive, or a combination of those, or even varying with time or temperature, the accuracy of the error compensation mechanism is not influenced by it. None of the methods presented in prior art share this advantage. Furthermore existing amplifier designs can be reused provided that the transfer functions of the backend stages are point-symmetrical within the meaning of the present invention.

Applications for a power amplifier module in accordance with the invention include mains fed applications, e.g. TV sound, PC audio, portable audio, car audio systems and all other kinds of audio and sound systems. However the present invention is not limited to the field of amplification of audio signals but can be employed for other kinds of signals as well. For example the present invention can be employed for high frequency applications.

BRIEF DESCRIPTION OF THE DRAWING

In the following a preferred embodiment of the invention is described in greater detail by making reference to the drawings in which.

DETAILED DESCRIPTION

Figure 1:
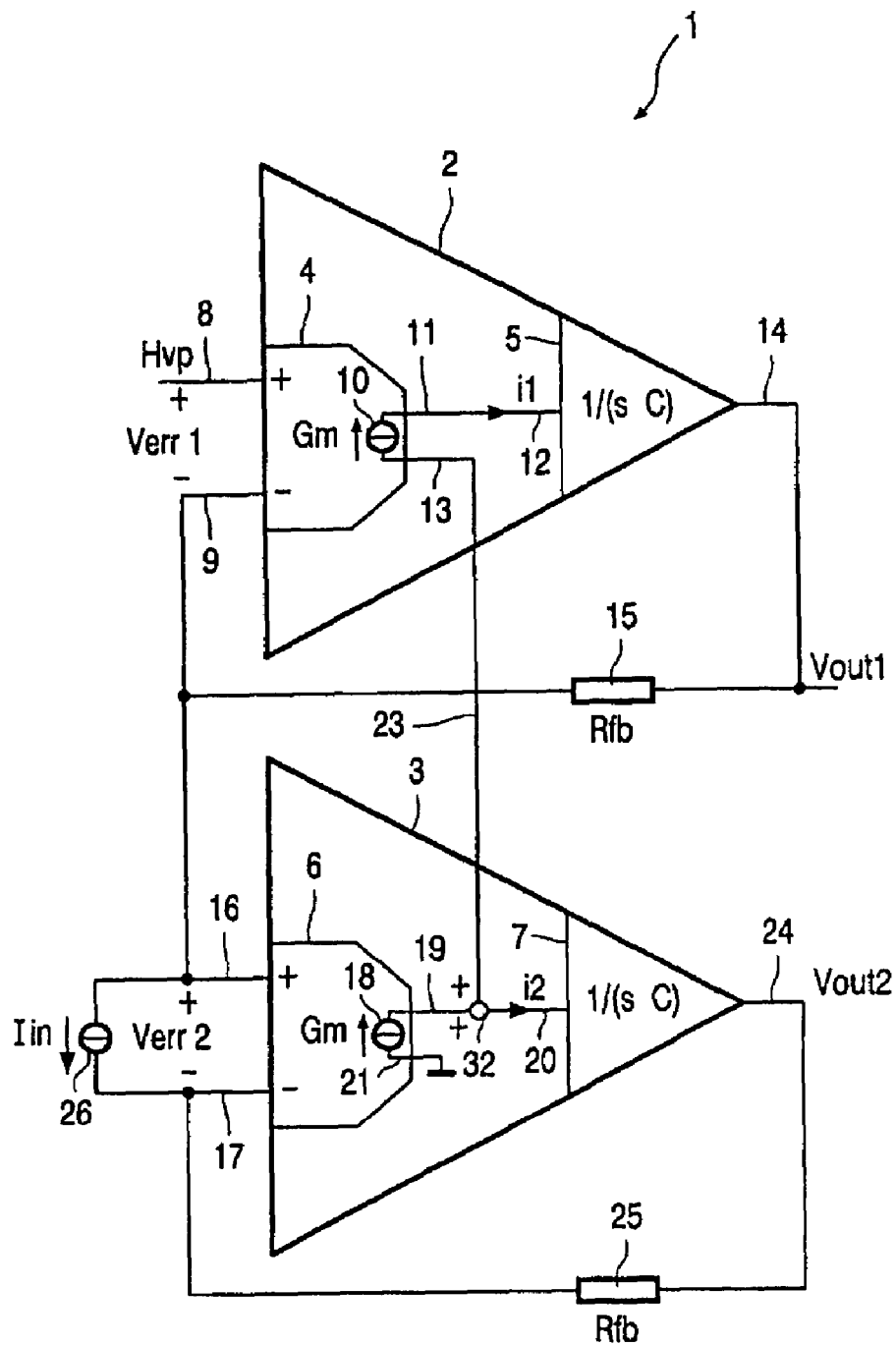
FIG. 1 is a schematic circuit diagram of a first embodiment of the invention.

FIG. 1 shows an embodiment of an amplifier module 1 in accordance with the invention. In the preferred embodiment considered here the amplifier module 1 is an integrated circuit which is realized on a single integrated circuit chip.

The amplifier module 1 comprises an amplifier 2 and an amplifier 3. The amplifier 2 has a front-end amplifier stage 4 and a backend amplifier stage 5. Likewise the amplifier 3 has front-end amplifier stage 6 and backend amplifier stage 7.

The front-end amplifier stage 4 has a non-inverting input terminal 8 and an inverting input terminal 9. The non-inverting input terminal 8 serves for application of a reference voltage Hvp, which normally has a value of half of the power supply voltage. The voltage across the non-inverting input terminal 8 and the inverting input terminal 9 is the error voltage Verr1.

The front-end amplifier stage 4 depicted in FIG. 1 is modelled by an operational transconductance amplifier with a transconductance Gm and a voltage controlled current source 10.

The voltage controlled current source 10 has an output terminal 11 which is connected to the input terminal 12 of the backend amplifier stage 5.

Further the voltage controlled current source 10 has an output terminal 13.

The backend amplifier stage 5 has an output terminal 14. The output terminal 14 is connected to the inverting input terminal of the amplifier 2 by means of resistor 15-Rfb.

The amplifier 3 has a non-inverting input terminal 16 and an inverting input terminal 17, corresponding to the non-inverting input terminal 8 and to the inverting input terminal 9 of the amplifier 2, respectively. The front-end amplifier stage 6 of amplifier 3 is also modelled as an operational transconductance amplifier with a transconductance of Gm and a voltage controlled current source 18. The voltage controlled current source 18 has an output terminal 19 which is connected to the input terminal 20 of the backend amplifier stage 7.

Further the voltage controlled current source 18 has an input terminal 21 which is connected to ground.

The current summing node 32 between the output terminal 19 and the input terminal 20 is connected by means of a wire 23 to the output terminal 13 of the voltage controlled current source 10 of amplifier 2.

The backend amplifier stage 7 has an output 24 which is coupled to the inverting input terminal 17 of the amplifier 3 by means of resistor 25-Rfb.

A current source 26 is applied between the non-inverting input terminal 16 and the inverting input terminal 17 to provide a signal current Iin. The signal current Iin is representative of the signal to be amplified by the amplifier module 1. Further the non-inverting input terminal 16 is connected to the inverting input terminal 9 of amplifier 2. This way a Bridge Tied Load (BTL) configuration with feedback over the load is created. The load is to be connected between the output terminals 14 and 24, i.e. between Vout1 and Vout2.

Both the backend amplifier stage 5 and the backend amplifier stage 7 comprise a Mille stage which in combination with the power stage forms a non-linear integrator, which is symbolized by $1/(sC)$.

It is to be noted that the backend amplifier stage 5 and the backend amplifier stage 7 have point symmetrical transfer functions with respect to the origin. Point symmetrical means the following here: Supposing that steering an output up requires to put in exactly the same current as the current which is to be drawn out in order to steer the same output down by the same amount. Furthermore, it is assumed that there is a load between Vout1 and Vout2. According to the current law of Kirchhoff, the output of the amplifier 2 would have to sink exactly the same amount of current as the output of the amplifier 3 needs to source—and conversely, whereby class AB or B operation for the backend stages is assumed. Further it is assumed that both amplifiers 2 and 3 are identical and that the integrator-power stage backend amplifier stages 5 and 7 have the required point symmetry.

In operation the current i1 that is fed into the upper backend amplifier stage 5 is equal of shape, though opposite of sign to the current i2 that is fed into the lower backend amplifier stage 7. If the transconductance (10) of the upper amplifier 2 would add a sign inverted copy of its output current to the lower backend amplifier stage 7, than the latter gets exactly the current it needs to provide an output signal with equal distortion as the upper amplifier 2. Thus, if the transconductance (18) of the amplifier (3) would not need to yield any current (for instance, if its Gm is chosen 0: no feedback), then the distortion of amplifier 3 would be equal to the distortion of the amplifier 2 As feedback over the load has been used (that is, the loopgain of amplifier 3 is greater than 0), the resulting distortion of amplifier 3 is reduced by that loopgain.

For the differential output signal Vout1–Vout2, only the distortion of amplifier 3 is relevant (the distortion of amplifier 2 is common mode for both Vout1 and Vout2). Thus, because of the mechanism described above, if amplifier 2 and amplifier 3 are identical, non-linear distortion from the backends is reduced with the square of the loopgain (which is the same for both amplifiers at any given frequency). Note that for conventional amplifiers without distortion compensation, it would have been reduced by the loopgain only. Note though, that for the distortion compensation mechanism to work, there is no need to choose the Gm of front-end 6 equal to the Gm of front-end 4.

In this application the amplifier 3 uses the amplifier 2 as a common mode reference. Thus, the loop of the amplifier 3 ideally does not "see" the loop of the amplifier 2. For that reason, the current that is derived from the loop of the amplifier 2 and which is fed into the amplifier 3 can be viewed as a feedforward controlling quantity.

In a practical implementation the backend amplifier stages 5 and 7 usually have some kind of ground referenced local feedback.

For that reason, the loops of both amplifiers will be able to "see" both of each other (especially at very low ohmic loads). Consequentially, the compensation current will have less of a feed-forward character. As a result, high frequency poles will become somewhat more complex as the compensation current is applied. In order to prevent this, the compensation current is filtered by an 80 kHz low-pass filter. In the audio frequency range the compensation remains equally as effective.

Figure 2:
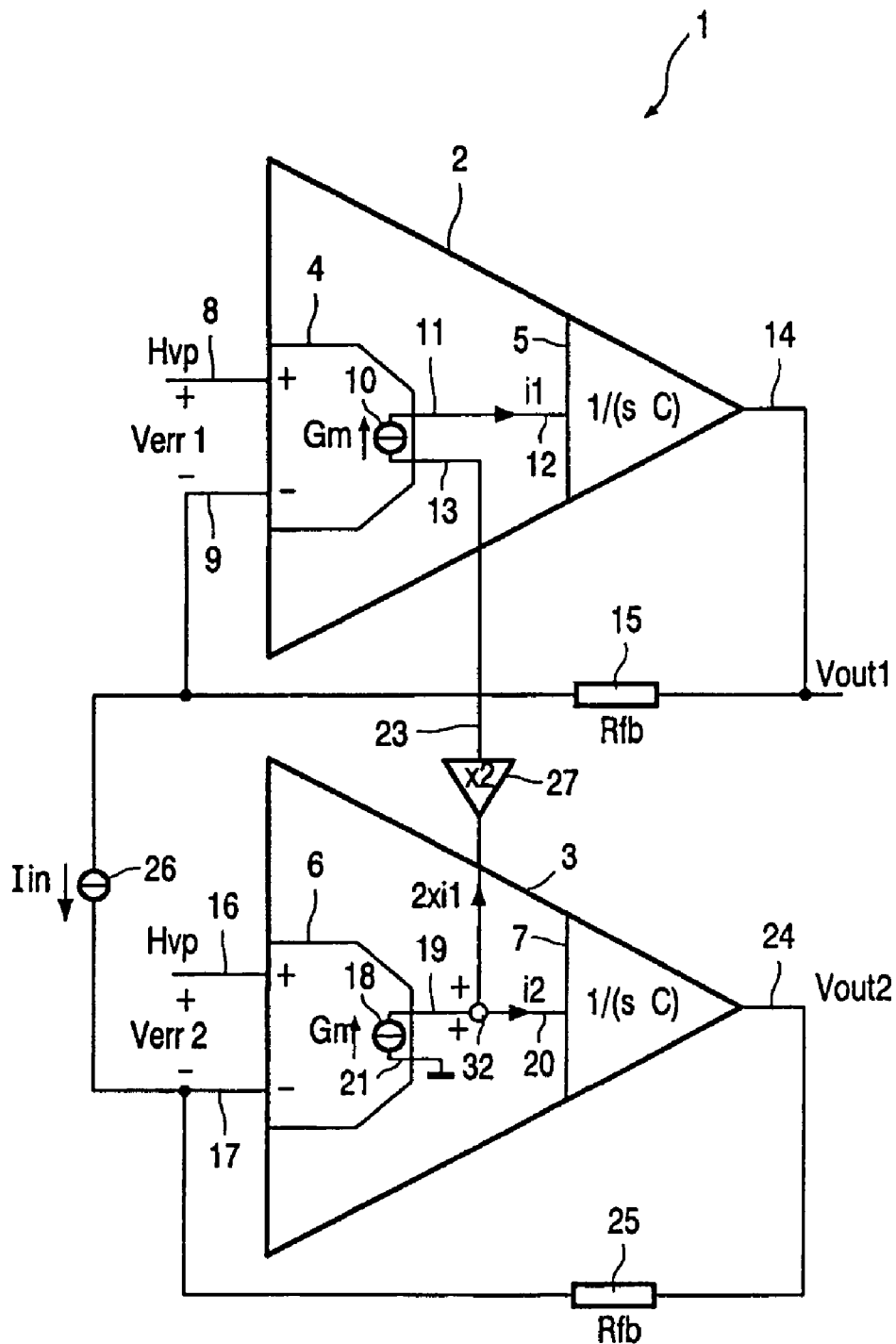
FIG. 2 is a schematic circuit diagram of a second embodiment of the invention.

FIG. 2 shows a block diagram of an alternative application of the present invention. Elements of FIG. 2 which correspond to like elements of FIG. 1 are designated by the same reference numerals.

In contrast to the circuit arrangement of FIG. 1 the amplifiers 2 and 3 of FIG. 1 are single ended amplifiers arranged in a Bridge Tied Load (BTL) configuration without feedback over the load. This is accomplished by connecting the current source 26 between the inverting input terminal 9 and the inverting input terminal 17 of the amplifiers 2 and 3 respectively. The reference voltage Hvp is applied to the non-inverting input terminals 8 and 16 of the amplifiers 2 and 3, respectively.

Further a current amplifier 27 is present in wire 23. The current amplifier 27 serves to provide the double current 2*i1 to the current summing node 32. This way the compensation current is amplified by a factor of two. Consequently, the amplifier 3 is overcompensated by 100%.

As a result the residual of the amplifier 3 becomes identical to that of the amplifier 2. The distortion thus becomes common mode. Therefore, in first order, differentially the distortion is eliminated. Therefore, both the feedback loops of amplifier 2 and 3 have a drastically reduced distortion to start with. In fact, the reduction mechanism very much resembles the mechanism that has been explained with reference to FIG. 1.

Again, if both amplifiers are equal, the part of the non-linear distortion of the backends that is perceivable across the load, is reduced by the square of the loopgain of each of the amplifiers 2 and 3. Note again, that for a conventional amplifier (that is, without wire 23 and current amplifier 27), the non-linear distortion of the backends would have been reduced by the loopgain only.

In an alternative application the current source 26 is removed and the amplifiers 2 and 3 are utilized for independent channels. In this case the load is connected between the respective output terminal and ground. This way additional flexibility for a variety of applications is provided. Of course, in that case, the current amplification factor of current amplifier 27 is switched to zero, in order to prevent cross-talk between both channels.

Figure 3:
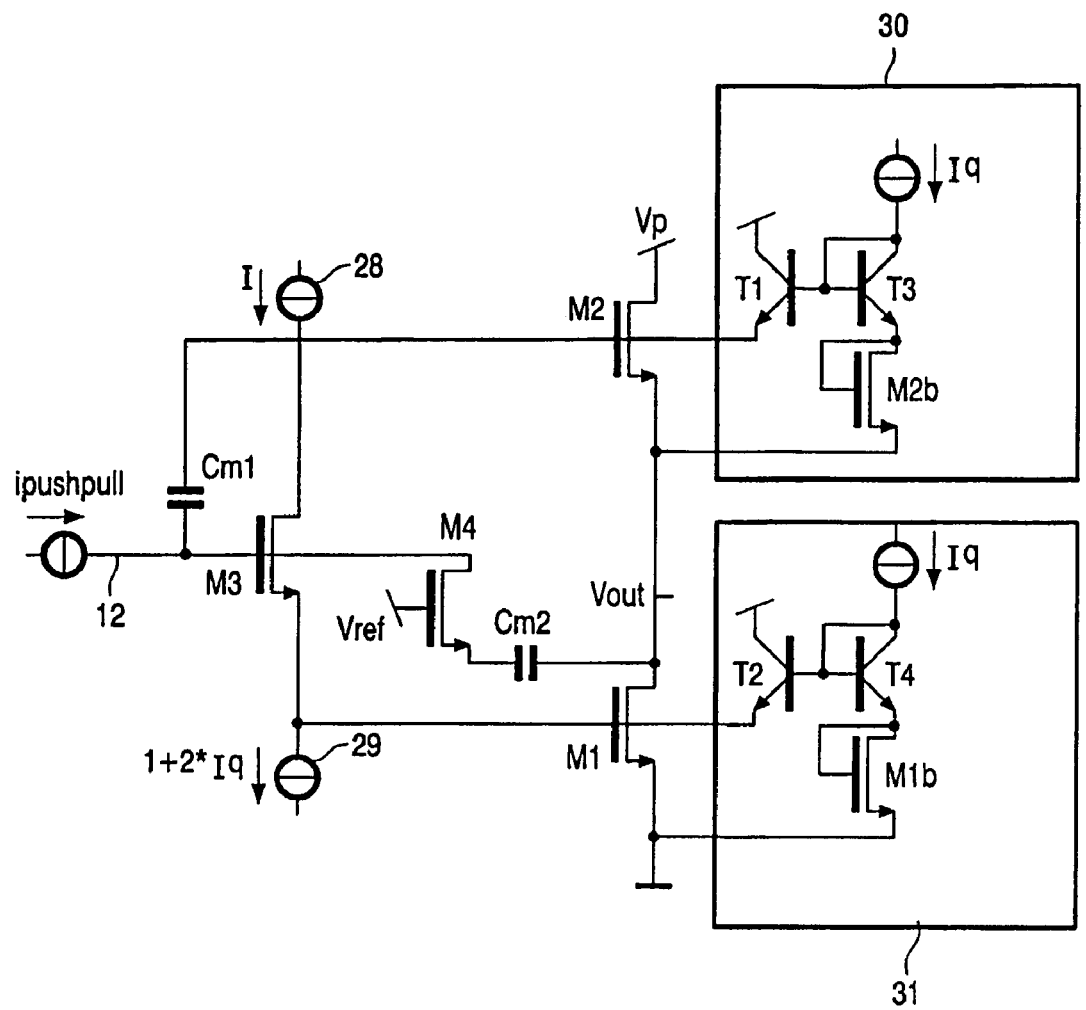
FIG. 3 is a schematic circuit diagram of an embodiment of a backend amplifier stage for use in the embodiments of FIGS. 1 and 2.

FIG. 3 shows a circuit diagram of a preferred embodiment of the backend amplifier stages 5 and 7, respectively. A capacitor Cm1 is connected to the input terminal of the backend amplifier stage. The other terminal of the capacitor Cm1 is connected to the gate of a power transistor M2. Further the gate of the transistor M3 is connected to the input terminal 12 (for the case of amplifier 2 and 20 if amplifier 3 is considered). A current source 28 is coupled to the gate of a transistor M2 and to the drain of the transistor M3. The source of the transistor M3 is coupled to a current sink 29. The current source 28 provides the current I and the current sink 29 sinks the current I+2xIq.

Further the gate of the transistor M3 is connected to the drain of a transistor M4. The gate of the transistor M4 is connected to a referenced voltage Vref. The source of the transistor M4 is connected to a capacitor Cm2. The transistor M4 serves to cascode the Miller capacitor Cm2.

The capacitor Cm2 is connected to the source of the power transistor M2 and to the drain of the power transistor M1. At this potential the output the voltage Vout is provided.

Further the backend module has clamps 30 and 31. A quiescent current control is implemented by using the clamps 30 and 31. The current Iq is fed into morror-most M2b. The clamp voltage which is obtained this way, is applied to the gate of M2 via clamp transistors T1 and T3. Using npn's for these transistors keeps the error of the clamping voltage low, which is important for being able to obtain an accurate quiescent current, as in quiescent conditions, M2 and M1 tend to operate in weak inversion.

During quiescent conditions, there's no voltage drop across the load. Therefore, no current leaves the amplifier. Consequentially, the currents through M1 and M2 must be equal, and so do their Vgs voltages. That in turn results in equal clamp currents through T1 and T2.

According to Kirchoff's current law, T1, T2, T3, T4, M1b and M2b should all conduct a current equal to 1q. The quiescent current through M1 and M2 thus becomes: 1q times the ratio of the areas between M1b and M1, and between M2b and M2 respectively.

The circuitry as depicted in FIG. 3 can be utilized for both the backend amplifier stage 5 and the backend amplifier stage 7 (cf. FIG. 1 and FIG. 2). This circuitry features a (dynamic-) point symmetrical current to voltage transfer and also accurate quiescent current control.

LIST OF REFERENCE NUMERALS amplifier module 1
amplifier 2
amplifier 3
front-end amplifier stage 4
backend amplifier stage 5
front-end amplifier stage 6
backend amplifier stage 7
non-inverting input terminal 8
inverting input terminal 9
voltage controlled current source 10
output terminal 11
input terminal 12
output terminal 13
output terminal 14
resistor 15
non-inverting input terminal 16
inverting input terminal 17
voltage controlled current source 18
output terminal 19
input terminal 20
input terminal 21
node 22
wire 23
output 24
resistor 25
current source 26
amplifier 27
current source 28
current sink 29
clamp 30
clamp 31
current summing node 32

The invention claimed is:

1. A power amplifier module comprising a first amplifier (2) having a first front-end (4) and a first backend amplifier stage (5) and a second amplifier (3) having a second front-end (6) and a second backend amplifier stage (7), the first amplifier and the second amplifier being arranged in a Bridge Tied Load (BTL) configuration with feedback over the load, characterized in that the first and the second backend amplifier stages having point symmetrical transfer functions with respect to the origin, the input current (i1) of the first backend amplifier stage being substantially equal to the input current (i2) of the second backend amplifier stage, wherein at least the first front-end amplifier stage comprises a voltage controlled current source (10), an output terminal (11) of the voltage controlled current source supplying the input current (i1) for the first backend amplifier stage and the output terminal (13) of the voltage controlled current source being connected to an input terminal (20) of the second backend amplifier stage.

2. A power amplifier module comprising a first amplifier (2) having a first front-end (4) and a first backend amplifier stage (5) and a second amplifier (3) having a second front-end (6) and a second backend amplifier stage (7), the first amplifier and the second amplifier being arranged in a Bridge Tied Load (BTL) configuration with feedback over the load, characterized in that the first and the second backend amplifier stages having point symmetrical transfer functions with respect to the origin, the input current (i1) of the first backend amplifier stage being substantially equal to the input current (i2) of the second backend amplifier stage, comprising an input arrangement for supplying an input signal current (Iin) over the non-inverting and inverting input terminals (16, 17) of the second front-end amplifier stage.

3. A power amplifier module comprising a first single ended amplifier (2) having a first front end (4) and a first backend amplifier stage (5) and a second single ended amplifier (3) having a second front end (6) and a second backend amplifier stage (7), the first and the second amplifiers being arranged in a Bridge Tied Load (BTL) configuration, characterized in that the first and the second backend amplifier stages having point symmetrical transfer functions with respect to the origin, the input current (i1) of the first backend amplifier stage being substantially equal to the input current (i2) of the second backend amplifier stage that has been provided from a summing node fed by inverted input current that has been doubled.

4. The power amplifier module of claim 3, the non-inverting input terminal of the front-end amplifier stage being adapted to be connected to a power supply voltage (Hvp).

5. The power amplifier module of claim 3 wherein the first front end amplifier stage comprises a voltage controlled current source (10), the voltage controlled current source having an output terminal (11) connected to the input (12) of the first backend amplifier stage and having an output terminal (13) connected to an amplifier (27) for providing the doubled inverted input current.

6. The power amplifier module of claim 3, the first and the second single ended amplifiers being arranged to be driven differentially.

7. A power amplifier module in accordance with claim 1, wherein the first and the second backend amplifier stages are realized by means of substantially identical circuitry.

8. A power amplifier module comprising a first amplifier (2) having a first front-end (4) and a first backend amplifier stage (5) and a second amplifier (3) having a second front-end (6) and a second backend amplifier stage (7), the first amplifier and the second amplifier being arranged in a Bridge Tied Load (BTL) configuration with feedback over the load, characterized in that the first and the second backend amplifier stages having point symmetrical transfer functions with respect to the origin, the input current (i1) of the first backend amplifier stage being substantially equal to the input current (i2) of the second backend amplifier stage, the first and the second backend amplifier stages each comprising an output capacitor (Cm2) interposed between transistors that are in a cascode configuration.

9. An audio system, such as a CD-player, DVD-player, television set, car radio or other audio system comprising a power amplifier module in accordance with claim 4 for the purposes of power amplification of an audio signal.

10. A method for creating a power amplifier module comprising:
   providing a first amplifier (2) having a first front-end (4) and a first backend amplifier stage (5);
   providing a second amplifier (3) having a second front-end (6) and a second backend amplifier stage (7), wherein the first amplifier and the second amplifier are arranged in a Bridge Tied Load (BTL) configuration with feedback over the load, wherein at least the first front-end amplifier stage comprises a voltage controlled current source (10);
   supplying, from an output terminal (11) of the voltage controlled current source, the input current (i1) for the first backend amplifier stage; and
   connecting the output terminal (13) of the voltage controlled current source to an input terminal (20) of the second backend amplifier stage,
   wherein the first and the second backend amplifier stages have point symmetrical transfer functions with respect to the origin, the input current (i1) of the first backend amplifier stage being substantially equal to the input current (i2) of the second backend amplifier stage.

* * * * *